United States Patent
Guo et al.

(10) Patent No.: US 7,394,248 B1
(45) Date of Patent: Jul. 1, 2008

(54) METHOD AND STRUCTURE TO RESET MULTI-ELEMENT MTJ

(75) Inventors: Yimin Guo, San Jose, CA (US); Grace Gorman, San Jose, CA (US)

(73) Assignee: Magic Technologies, Inc., Milpitas, CA (US)

( * ) Notice: Subject to any disclaimer, the term of this patent is extended or adjusted under 35 U.S.C. 154(b) by 0 days.

(21) Appl. No.: 11/888,854

(22) Filed: Aug. 2, 2007

(51) Int. Cl.
*G01R 33/02* (2006.01)

(52) U.S. Cl. .................. 324/252; 324/207.21; 324/249

(58) Field of Classification Search ............ 324/207.21, 324/249, 252; 438/3; 257/295, 421–422, 257/425; 360/324–324.2
See application file for complete search history.

(56) References Cited

U.S. PATENT DOCUMENTS

| | | | |
|---|---|---|---|
| 6,529,114 B1 | 3/2003 | Bohlinger et al. | |
| 6,930,479 B2 | 8/2005 | Xiao et al. | |
| 2006/0071655 A1 | 4/2006 | Shoji | |
| 2006/0170529 A1 | 8/2006 | Shoji | |

OTHER PUBLICATIONS

Co-pending U.S. Appl. No. 11/788,912, filed Apr. 23, 2007, "MTJ Sensor Including Domain Stable Free Layer", Assigned to the Same Assignee as the Present Invention.

*Primary Examiner*—Bot LeDynh
(74) *Attorney, Agent, or Firm*—Saile Ackerman LLC; Stephen B. Ackerman

(57) ABSTRACT

The process margin for the manufacture of devices formed from multi-element MTJ or GMR devices has been widened by providing a method and structure to reset the magnetization directions of all pinned layers simultaneously so that their directions of magnetization become evenly distributed. This has the effect of minimizing non-linearity and hysteresis in these devices during their subsequent operation.

18 Claims, 4 Drawing Sheets

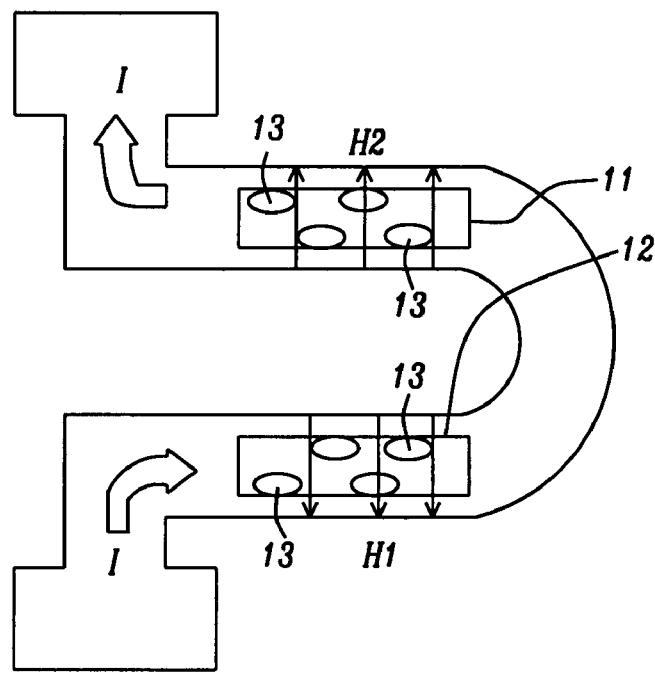
FIG. 1 – Prior Art

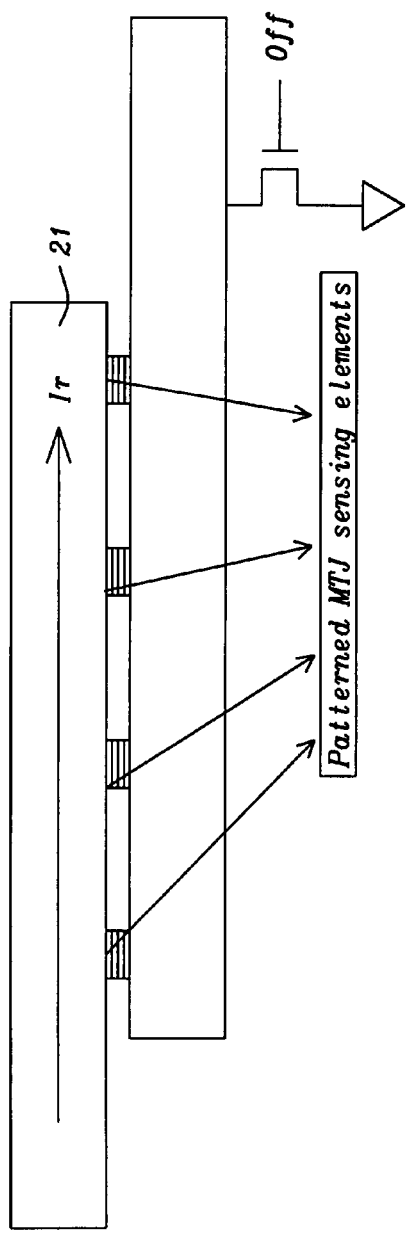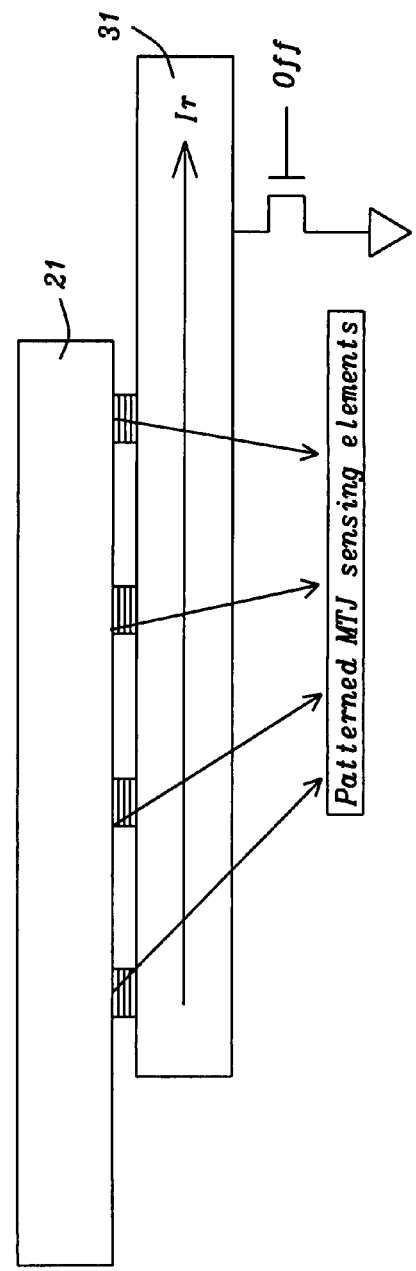

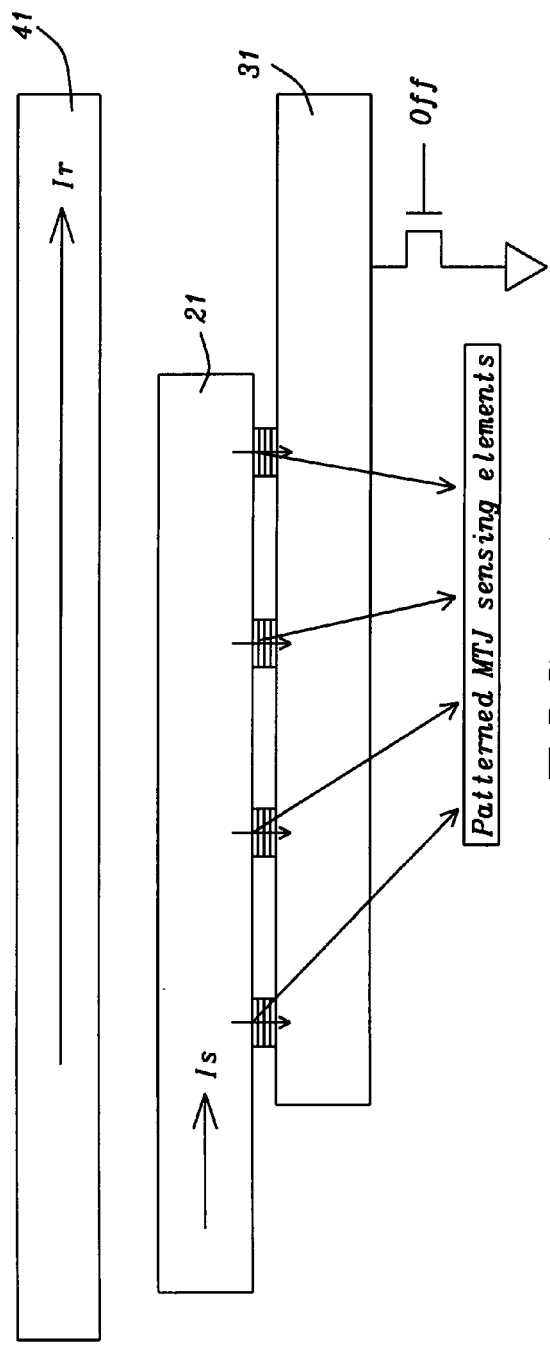
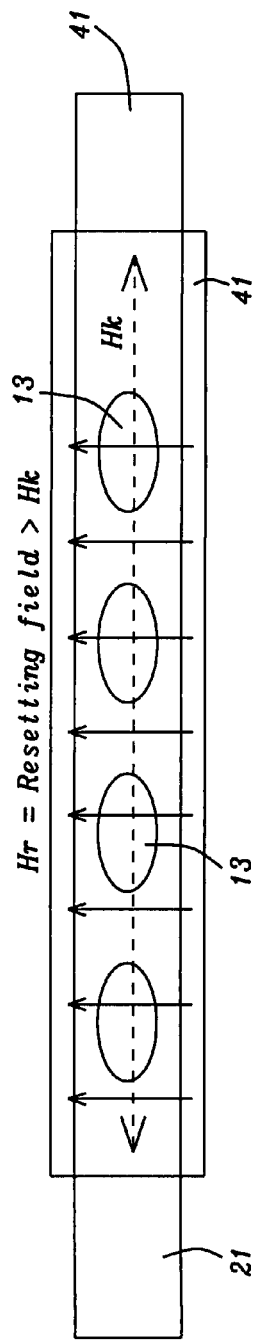
FIG. 4
FIG. 5

US 7,394,248 B1

METHOD AND STRUCTURE TO RESET MULTI-ELEMENT MTJ

This application is related to HMG06-046, filed on Apr. 23, 2007 as application Ser. No. 11/788,912, and herein incorporated, by reference, in its entirety.

FIELD OF THE INVENTION

The invention relates to the general field of magnetic field detection by MTJ or GMR devices with particular reference to magnetization reset techniques.

BACKGROUND OF THE INVENTION

The present invention relates to a magnetic field sensor using a highly sensitive MTJ (magnetic tunnel junction) device. Its applications include use as a current sensor capable of sensing very small changes in the current flowing through a conductor.

In a conventional current sensor, the sensing elements are two long GMR (Giant Magneto-resistance) bearing stripes disposed adjacent to a conductor to be measured in an in-plane direction. Such a current sensor includes: the conductor bent into a U shape; first and second GMR elements located on the conductor on opposing legs of the U so that a magnetic field generated by a nearby conductor will induce opposite magneto-resistance changes in the two GMR devices; and first and second constant current sources that supply constant and equal currents to the first and second GMR elements. The current sensor further includes a differential amplifier that detects the difference between the voltage drops across the first and second GMR elements. The field current is then detected based on the difference between the two voltage drops.

The scheme described above is schematically illustrated in FIG. 1. As can be seen, the two GMR devices 11 and 12 both lie on the U-shaped current sensor, but on opposing legs thereof. Consequently, the reference layers of the two magnetic sensing devices 11 and 12 are pinned in opposite directions (relative to the magnetic fields H1 and H2 generated by the current in each leg) thereby ensuring that their resistances will change by different amounts when exposed to a magnetic field generated by the same current I. An important feature of this structure is that it is insensitive to the influence of noise from undesired external small magnetic fields as well as to resistance variations due to temperature change.

For this scheme to work properly, the magnetization of each GMR element's free layer has to remain in a single domain state. However, a large external magnetic field (one greater than about 60 Oe) could change the single domain state of a GMR or MTJ free layer into multiple domain states, leading to hysteresis of the magnetic response and causing current reading errors. To address this problem, the prior art device discussed above includes means for imposing on the free layer a longitudinal magnetic bias. Said means take the form of a pair of permanent or exchange coupled magnets, one such pair for each sensor. Aside from the additional cost that this adds to the manufacturing process, use of longitudinal bias will also reduce the sensitivity of the device which may be further degraded by changes in the permanent bias over time.

The problem was solved (as disclosed in the invention incorporated herein by reference) by subdividing the free layer of each conventional GMR/TMR device into multiple sub-elements, such as 13, that share common top and bottom electrodes. The resulting magnetic detector is domain stable in the presence of large stray fields so the need for longitudinal bias magnets was removed.

1. U.S. Pat. Application No. 20060071655, Shoji; Shigeru
2. U.S. Pat. Application No. 20060170529, Shoji; Shigeru
3. U.S. Pat. No. 6,529,114 B1, . . . M. Bohlinger, et al.

SUMMARY OF THE INVENTION

It has been an object of at least one embodiment of the present invention to widen the process margin for the manufacture of devices formed from multi-element MTJ or GMR devices while at the same time minimizing non-linearity and hysteresis in such devices, thereby improving production yield.

Another object of at least one embodiment of the present invention has been to provide a method to reset the magnetization directions of all pinned layers simultaneously so that said directions of magnetization are evenly distributed.

Still another object of at least one embodiment of the present invention has been to provide a structure whereby said method can be implemented.

These objects have been achieved by exposing said multi-element devices to a magnetic pulse of magnitude greater than the anisotropy fields of the devices and oriented at right angles thereto. Passing a current pulse through a conductive line located near, and parallel to, the multi-element devices generates this magnetic pulse. The conductive line itself may be a separate line, suitably located, or either of the devices' top or bottom electrodes may be used.

BRIEF DESCRIPTION OF THE DRAWINGS

FIG. 1 shows the electric current sensor described in application Ser. No. 11/788,912 which, as noted above, has been incorporated by reference.

FIGS. 2-4 illustrate three embodiments of the invention wherein a magnetic pulse of magnitude greater than the anisotropy field is used to distribute differences in the directions of magnetization of the MTJ or GMR elements evenly, thereby greatly reducing subsequent non-linearity and hysteresis.

FIG. 5 shows the direction of the reset field relative to the anisotropy field.

DESCRIPTION OF THE PREFERRED EMBODIMENTS

Figures 6A, 6B:
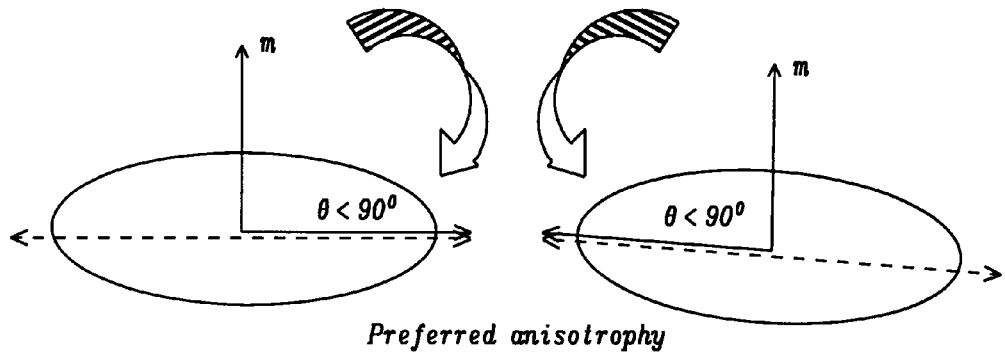
FIGS. 6a and 6b show how the effect of slight deviations of the hard axis from the vertical direction (due to processing variations or intrinsic magnetization variation) can be neutralized by the application of the reset magnetic pulse.

The present invention discloses a structure (and process for its manufacture) that reduces some of the constraints placed on the manufacture and operation of this device, thereby making for a wider processing window which in turn leads to improved process yield. The following references also relate to the field covered by the present invention:

As noted above, in the present invention multiple ellipse-shaped MTJ elements are arranged along the long axis of a top electrode and a bottom electrode, and MTJ element anisotropies (or their long axis) are also aligned to the long axis of a top electrode and a bottom electrode, the top or bottom electrode serves as a conducting layer carrying a short pulse of electric current flowing along its long axis which is parallel to the total anisotropy (or long axis) directions of the MTJ elements.

For each MTJ element, when the angle between anisotropy axis and pinned reference magnetization direction is different from 90-degree, a small non-linearity will occur in the signal response. The sign of this non-linearity depends upon whether the angle is larger or less than 90 degrees. During assembly or in applications where the MTJ sensing structure is affected by stray magnetic fields, some of its MTJ elements may have their quiescent magnetizations unintentionally switched, thereby causing a read error.

If a current is sent along the top or bottom electrode layer, it generates a magnetic field perpendicular to the total anisotropy direction of each MTJ element. When the field strength generated by a short current pulse is larger than the total anisotropy, the free layer magnetization will always settle in a preferred direction along its anisotropy axis. Statistically, half the MTJ elements will have their preferred directions toward the right while the other half will have their preferred direction to the left. As a result, a major fraction of the signal non-linearity gets canceled out, resulting in good net linearity of signal response without hysteresis.

Such a feature, namely the ability to reset the magnetization directions of all pinned layers so that they are evenly distributed, thus eliminates hysteresis and reduces non-linearity caused by a possible asymmetric distribution of the two pinning magnetization directions. An important consequence of this is that the process margin will be widened which, in turn, makes for a better production yield.

The first of three embodiments is illustrated in FIG. 2. As shown there, the reset current $I_r$ is sent through the upper MTJ electrode 21. In the second embodiment, illustrated in FIG. 3, $I_r$ is sent through the lower MTJ electrode. In the third embodiment, illustrated in FIG. 4, the short pulse of electric current flowing parallel to the total anisotropy (or long axis) directions of the MTJ elements is sent through an independent reset line that is dedicated to this purpose. Although the figure shows this line to be above the MTJ sensing structure, it could function equally well if located beneath the MTJ structure. In both case, it is separated from the MTJ sensing structure by an insulating layer.

As a current flows along the top or bottom electrode layer, it generates a magnetic field $H_r$ perpendicular to the total anisotropy direction of each MTJ element, as illustrated in FIG. 5. When the field strength generated by a short current pulse is larger than the total anisotropy $H_k$, the free layer magnetization will always settle in a preferred direction along its anisotropy axis, depending on each individual anisotropy deviation.

As shown in FIGS. 6a and 6b, before each sensing operation an electric current pulse is applied to the top or bottom electrode layer, generating a magnetic field to saturate the free magnetization along the vertical direction and setting the free magnetization in the preferred direction of its easy or anisotropy axis. For each MTJ element, its hard axis may be slightly deviated from the vertical direction due to processing variation or intrinsic magnetization variation, the preferred direction of anisotropy is the one which has an angle less than 90-degree from the applied field direction. The angle distribution of many MTJ elements would be centered at or close to 90-degree and a standard deviation of anisotropy direction.

For each MTJ element, when the angle between anisotropy axis and pinned reference magnetization direction is different from 90-degree, a small non-linearity would occur in signal response. The sign of this non-linearity depends upon whether the angle is larger or less than 90 degrees. In the present invention, there are multiple MTJ elements in the sensing structure. After application of a short large magnetic pulse in the vertical direction, each MTJ free magnetization will be set in its own preferred anisotropy direction. Among different MTJ elements, their preferred anisotropy directions may be opposite due to the difference in their anisotropy direction deviations. As the number of MTJ elements is large enough (more than 50), statistically about half the MTJ elements will have their preferred directions to the right (see FIG. 6a), while the remainder will have their preferred direction to the left (see FIG. 6b). As a result, much of the individual signal non-linearities will cancel out, resulting in good net linearity of signal response.

Figure 7:
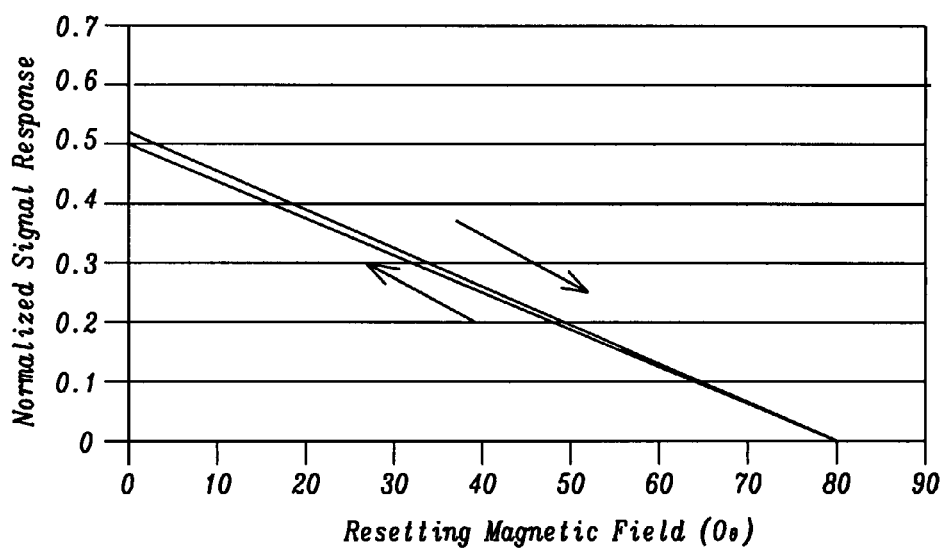
FIG. 7 illustrates the resetting field cycle from zero to a value larger than Hk and then back to zero.

As noted earlier, should the MTJ sensing structure be affected by a stray magnetic field, during assembly or use, some of its MTJ elements may have their quiescent magnetizations switched from their preferred directions to the opposite. So, to eliminate reading errors, a short pulse of current is applied to the top or bottom electrode layer, to generate a larger magnetic field than Hk and so set all MTJ free magnetizations in their preferred anisotropy directions. The transfer curve of this process is shown in FIG. 7.

What is claimed is:

1. A method to improve process yield by reducing non-linearity and hysteresis during operation of a multi-element magnetic sensor, comprising:

fabricating each of said elements as a multilayer stack whose aspect ratio, in plan view, exceeds 1.2, whereby each element has an anisotropy axis and an associated anisotropy field that determines a preferred direction for magnetization of the element, all such anisotropy axes being parallel to each other;

providing a common top electrode for the elements and connecting said common top electrode to a common bottom electrode through said elements;

exposing said sensor to a magnetic pulse whose direction is perpendicular to said anisotropy axes and whose magnitude exceeds said anisotropy field; and thereby causing each element to be magnetized along its anisotropy axis in a direction that is parallel to about half that of said elements and antiparallel to that of all remaining elements in said magnetic sensor.

2. The method of claim 1 wherein each of said multilayer stacks is selected from the group consisting of MTJ and GMR devices.

3. The method of claim 1 wherein said magnetic pulse is delivered by passing a current through said common top electrode.

4. The method of claim 1 wherein said magnetic pulse is delivered by passing a current through said common bottom electrode.

5. The method of claim 1 wherein said magnetic pulse is delivered by passing a current through a wire disposed to lie above said magnetic sensor and separated therefrom by an insulating layer.

6. The method of claim 1 wherein said magnetic pulse is delivered by passing a current through a wire disposed to lie below said magnetic sensor and separated therefrom by an insulating layer.

7. The method of claim 1 wherein each multi-element magnetic structure comprises at least 50 of said elements.

8. The method of claim 1 wherein each of said multilayer stacks has an elliptical shape.

9. The method of claim 1 wherein the aspect ratio of each of said stacks is at least 2.

10. A structure that reduces non-linearity and hysteresis during operation of a multi-element magnetic sensor, comprising:

each of said elements being a multilayer stack whose aspect ratio, in plan view, exceeds 1.2, whereby each element has an anisotropy axis and an associated anisotropy field that determines a preferred direction for magnetization of the element, all such anisotropy axes being parallel to each other;

a common top electrode for the elements that connects said common top electrode to a common bottom electrode through said elements;

a reset line which, when energized, will expose said sensor to a magnetic pulse whose direction is perpendicular to said anisotropy axes and whose magnitude exceeds said anisotropy field; and each element having a preferred direction of magnetization along its anisotropy axis that is parallel to that of about half of said elements and antiparallel to that of all remaining elements in said magnetic sensor.

11. The structure described in claim 10 wherein each of said multilayer stacks is selected from the group consisting of MTJ and GMR devices.

12. The structure described in claim 10 wherein said structure is said common top electrode.

13. The structure described in claim 10 wherein said structure is said common bottom electrode.

14. The structure described in claim 10 wherein said structure is a wire disposed to lie above said magnetic sensor, separated therefrom by an insulating layer.

15. The structure described in claim 10 wherein said structure is a wire disposed to lie below said magnetic sensor, separated therefrom by an insulating layer.

16. The structure described in claim 10 wherein each multi-element magnetic structure comprises at least 50 of said elements.

17. The structure described in claim 10 wherein each of said multilayer stacks has an elliptical shape.

18. The structure described in claim 10 wherein each stack has an aspect ratio of at least 2.

* * * * *

UNITED STATES PATENT AND TRADEMARK OFFICE
CERTIFICATE OF CORRECTION

| | |
|---|---|
| PATENT NO. | : 7,394,248 B1 |
| APPLICATION NO. | : 11/888854 |
| DATED | : July 1, 2008 |
| INVENTOR(S) | : Yimin Guo and Grace Gorman |

It is certified that error appears in the above-identified patent and that said Letters Patent is hereby corrected as shown below:

On the Title Page Item (73), delete Assignee, "Magic Technologies, Inc., Milpitas, CA (US)" and replace with -- MagIC Technologies, Inc., Milpitas, CA (US) --.

Signed and Sealed this

Fourth Day of November, 2008

JON W. DUDAS
*Director of the United States Patent and Trademark Office*